United States Patent [19]

Schwartz

[11] Patent Number: 5,197,020
[45] Date of Patent: Mar. 23, 1993

[54] WAVE DIGITAL FILTER COMPOSED OF DELAYS AND N-PORT ADAPTORS

[75] Inventor: Hans-Dieter Schwartz, Munich, Fed. Rep. of Germany

[73] Assignee: Siemens Aktiengesellschaft, Munich, Fed. Rep. of Germany

[21] Appl. No.: 644,117

[22] Filed: Jan. 22, 1991

[30] Foreign Application Priority Data

Feb. 20, 1990 [DE] Fed. Rep. of Germany ..... 40005320

[51] Int. Cl.⁵ .............................................. G06F 15/31
[52] U.S. Cl. ............................................... 364/724.14
[58] Field of Search .................. 364/724.14; 333/202, 333/203, 168

[56] References Cited

U.S. PATENT DOCUMENTS 4,192,008  3/1980  Mandeville ..................... 364/724.14
4,827,443  5/1989  Meerkotter et al. ............ 364/724.14

FOREIGN PATENT DOCUMENTS 3314647 10/1984 Fed. Rep. of Germany.

OTHER PUBLICATIONS

Claasen et al, "Some Consideration on the Implementation of Digital Systems for Signal Processing", *Philip Res. Repts* 30, 73–84, 1975.

Sikström, "Implementations of Wave Digital Filters Using Modular Hardware", Conference: International Conference on Digital Processing of Signals in Communications, Loughborough, Leics, England (Apr. 1–10, 1981).

"Wave Digital Biquads Derived from RC-Active Configurations", C. Eswaran et al, *IEEE Transactions on Circuits and Systems*, vol. Cas-31, No. 9, Sep., 1984, pp. 779–787.

"Limit-Cycle Free Complex Biquad Recursive Digital Filters", K. S. Prasad et al, *IEEE Transactions on Circuits and Systems*, vol. 36, No. 2, Feb., 1989, pp. 280–285.

*Primary Examiner*—Tan V. Mai
*Attorney, Agent, or Firm*—Hill, Steadman & Simpson

[57] ABSTRACT

A wave digital filter wherein structures are specified such that the transfer function (Y/X) can be arbitrarily prescribed. The filter input signal X—individually weighted via multipliers ($E_1 \ldots E_x$)—is input at all adaptor inputs and outputs with adders. The filter output signal Y is formed by summation of the signals weighted via further multipliers ($A_a \ldots A_y$) which are output at all adapter and delay inputs and outputs.

8 Claims, 4 Drawing Sheets

WAVE DIGITAL FILTER OUTPUT TYPE CANONIC ATTENUATION EQUALIZER

WAVE DIGITAL FILTER COMPOSED OF DELAYS AND N-PORT ADAPTORS

BACKGROUND OF THE INVENTION

The invention is directed to a wave digital filter (WDF) having delays and N-port adaptors, the N-port adaptors in turn having multipliers and adders.

Digital filters including digital equalizers digitally process samples of discrete values over time. Their fundamental function is described by their structure (signal graph) and their transfer function H(z) (ratio Y/X of the z-transform of output signal to input signal) The most important known structures of recursive digital filters or equalizers are direct forms of the higher order, cascade circuits of sub-structures of a lower order, parallel circuits of sub-structures of a lower order, wave digital filter ladder structures, wave digital filter lattice structures, and wave digital filter all-pass structures.

The following is a bibliography which is incorporated herein by reference with respect to wave digital filters, their theory and practice, their pseudo passivity, and the potential appearance of parasitic oscillations in such wave digital filters:

(1) Fettweis, A.: Digital Filter Structures Related to Classical Filter Networks, Arch. elektr. Ubertr. 25 (1971) 2, pp. 79-89.

(2) Fettweis, A.: Pseudopassivity, Sensitivity, and Stability of Wave Digital Filters, IEEE Trans. Circuit Theory 19 (1972) 6, pp 668-673.

(3) Fettweis, A.; Levin, H.; Sedlmeyer, A.: Wave Digital Lattice Filters, Int. J. Cir. Theor. App. 2 (1974) 2, pp. 203-211.

(4) Fettweis, A.; Meerkötter, K.: Suppression of Parasitic Oscillations in Wave Digital Filters, IEEE Trans. Circuits Syst. 22 (1975) 3, pp. 239-246.

(5) Fettweis, A.: Wave Digital Filters: Theory and Practice, Proc. IEEE 74 (1986) 2, pp. 270-327. Known problems in the implementation of recursive digital filters/equalizers are:

A. As a consequence of the hardware-conditioned, finite calculating precision, rough limit cycles and/or large-scale overflow oscillations can appear over the long duration, even given a zero signal at the input. This problem occurs in structures that are designed as direct forms of a higher order, or as cascades or parallel circuits of sub-structures of a lower order.

B. Not every fractional, rational transfer function that is arbitrarily allowable in view of order and values can be realized in a uniform way. This problem arises with increasing acuteness in the aforementioned wave digital filter structures.

C. The calculating requirements that limit the performance capability of the hardware increases greatly with increasing order of the transfer function given structures with direct forms of a higher order or with wave digital all-pass structures according to reference (5).

No known structure is thus without one of the above mentioned problems.

Previously, one has proceeded in the following way in order to resolve the existing problems.

Problem A

The influences of the finite calculating precision are individually investigated when matched to the existing, concrete transfer function;

insofar as possible, either the influences are alleviated, or are accepted with counter-measures adapted to the individual case; or one can have recourse to counter-measures that are known for respectively small classes of transfer functions; or wave digital filter structures are used that do not have the problem as a result of the pseudo-passivity of the adaptor modules employed (see references 2, 4).

Problem B

A suitable approximation of the planned transfer function is defined; or one can sidestep to the aforementioned direct forms or, respectively, cascades or parallel circuit structures.

Problem C

No proposed solutions of this are known.

SUMMARY OF THE INVENTION

An object of the invention is to specify wave digital filter structures wherein the transfer function (y/x) is arbitrarily prescribable. What are referred to as canonic forms can also be specified, i.e. forms wherein the WDF structures are canonical with respect to multipliers and number of delays, i.e. the plurality of free parameters in the transfer function corresponds to the elements of the circuit.

This object is inventively achieved by a wave digital filter wherein wave digital filter circuit means comprising interconnected adaptors, delays, multipliers, and adders are provided for defining an arbitrary transfer function, the circuit means corresponding in order and values to intrinsic values of the transfer function. A filter input is provided to which a filter input signal can be applied, and a filter output is provided at which a filter output signal is available. The filter input is connected to a plurality of inputs of the wave digital filter circuit means by respective multiplier means for individually weighting the input signal to create weighted input signals at each of the wave digital filter circuit means inputs. The filter output is connected by a respective multiplier means to the wave digital filter circuit means individual outputs for weighting individual output signals from the wave digital filter circuit means.

DESCRIPTION OF THE PREFERRED EMBODIMENTS

Following hereafter are descriptions for the individual circuits.

According to the considerations on which the invention is based, a wave digital filter/equalizer having an arbitrarily prescribable transfer function Y/X is provided. It has a wave digital filter structure which matches the order g and the denominator zero positions of the transfer function. This WDF is preferably a wave digital filter all-pass structure that, as known, has a regular structure of two-port adaptors and delays (see FIG. 1 and FIG. 2). Individually weighted via multipliers $E_1 \ldots E_x$, the filter/equalizer input signal X is coupled in at all adaptor inputs and outputs via adders. The filter/equalizer output signal Y is formed by summing up the signals weighted via further multipliers $A_a \ldots A_y$, which are individually output at all adaptor and delay inputs and outputs—see FIG. 3 in combination with, for example, FIG. 1b.

Figure 1A:
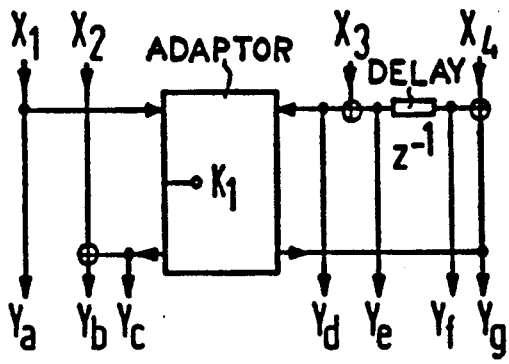
FIG. 1a shows a wave digital filter all-pass of a first order (thick lines) supplemented to form a first order resonator core.
Figure 1C:
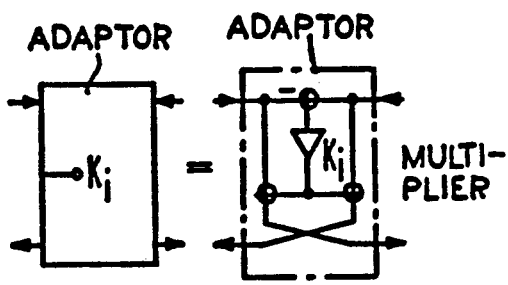
FIG. 1c shows an inner adaptor structure having a core factor K, as an example.
Figure 1B:
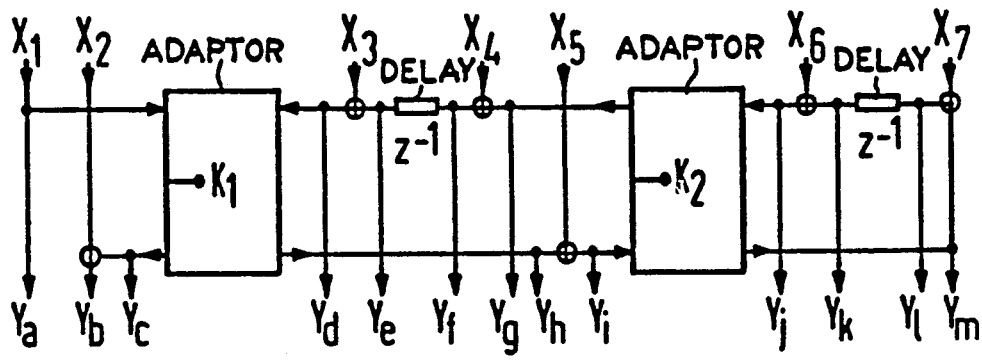
FIG. 1b shows a wave digital filter all-pass of a second order (thick lines) supplemented to form a second order resonator core.

A wave digital filter all-pass of degree 1 which is shown with thick lines may be seen in FIG. 1a. This is augmented to form a first order resonator core having 4 individual input circuit points and 7 individual output circuit points. The individual input circuit points are referenced $X_1$ through $X_4$; and the individual output circuit points are referenced $Y_a$ through $Y_g$. FIG. 1b shows a wave digital filter all-pass of the second order shown in thick lines in the drawing. It is supplemented to form a second order resonator core having 7 individual input circuit points and 13 individual output circuit points. The individual input circuit points here are referenced $X_1$ through $X_7$ and the individual output circuit points are referenced $Y_a$ through $Y_m$. FIG. 1c shows an adaptor and an example of an inner structure thereof which is formed of a multiplier $K_i$ and of adders (+), and which acts here as a module of a wave digital filter (WDF) all-pass.

Figure 2:
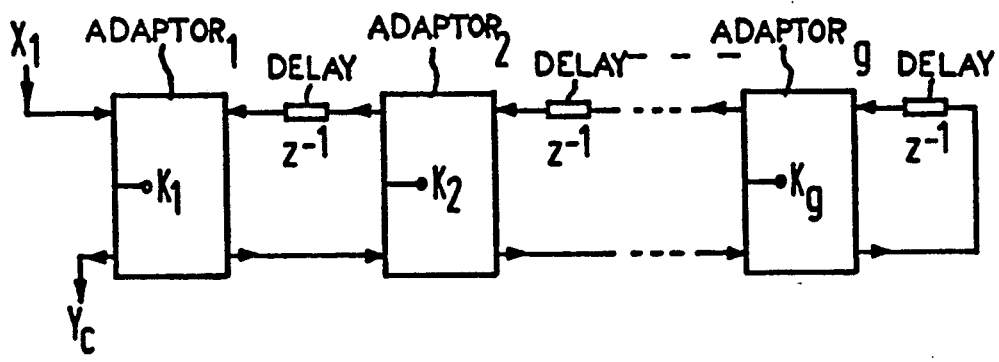
FIG. 2 is a wave digital filter all-pass of order g.

FIG. 2 shows a wave digital filter all-pass of order g that is formed of g adaptors each having a multiplier $K_i$ (i=1 . . . g). Associated therewith are g delays that are referenced $z^{-1}$. The input signal $x_1$ and the output signal $y_c$ are shown.

Figure 3:
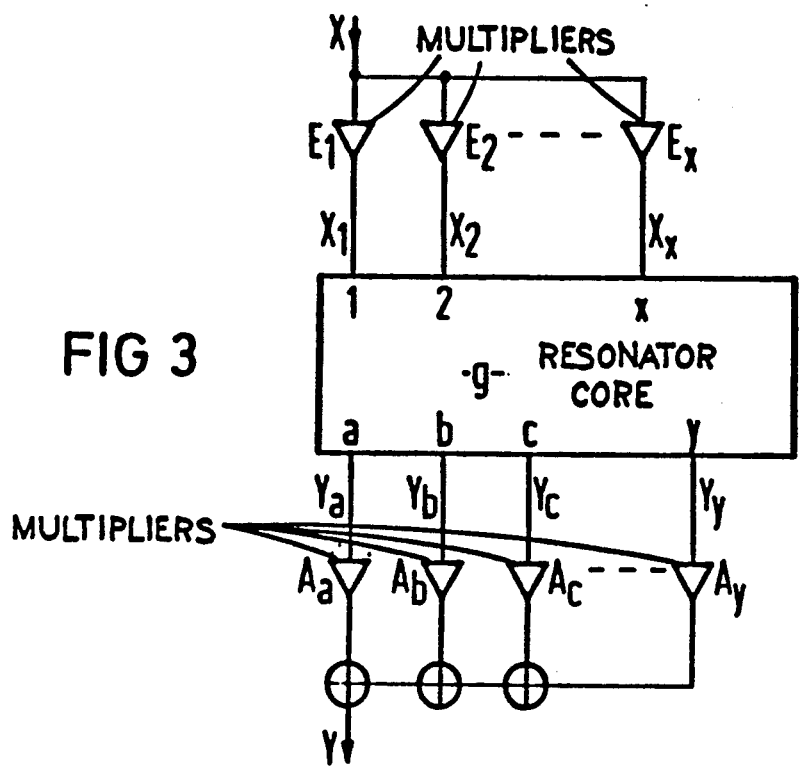
FIG. 3 is a complete input circuit and output circuit at a g order resonator core.

FIG. 3 shows a complete input circuit and output circuit at the g order resonator core. The input occurs via individual input multipliers $E_1$ through $E_x$, and the output occurs via individual output multipliers $A_a$ through $A_y$. In accordance with the above descriptions, the input signal is referenced X and the output signal is referenced Y. It may also be seen in the circuit of FIG. 3 that the input signal X is split into the individual input signals $X_1, X_2 \ldots X_x$ via the multipliers $E_1, E_2 \ldots E_x$. These individual input signals proceed into the g order resonator core at the points 1, 2, . . . x. The individual output signals $Y_a, Y_b, Y_c, \ldots Y_y$ appear at the points a, b, c, . . . y. Each of these individual output signals is independently conducted via the multipliers $A_a, A_b, A_c \ldots A_y$. The individual output signals of the multipliers $A_a$ through $A_y$ are combined via adders (+) and appear as output signal Y of the filter circuit.

Figure 4:
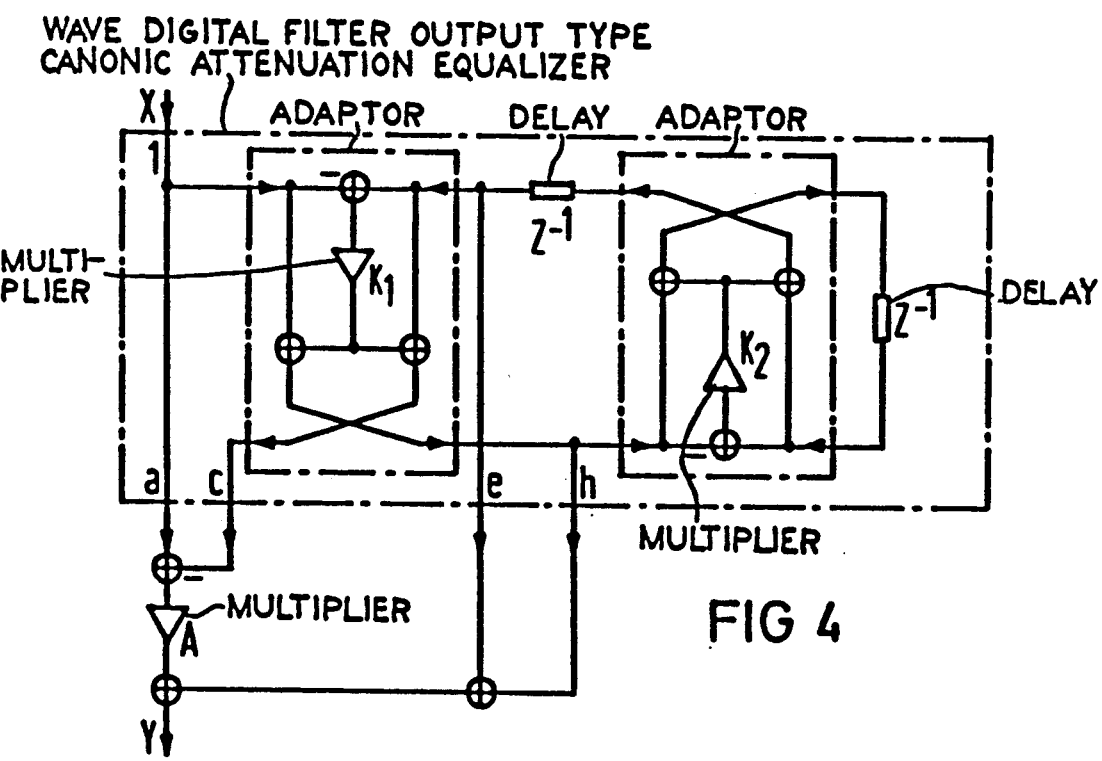
FIG. 4 is an exemplary embodiment of a so-called "output type" wave digital filter variable attenuation equalizer having a transfer function of order 2—the bandwidth can thus be influenced with a module $K_1$, the resonant frequency can be influenced with a module $K_2$, and the amplitude can be influenced with a module A.

FIG. 4 shows an exemplary embodiment of a so-called "output type" attenuation equalizer, i.e. the input of the input signal X having a weighting 1 is undertaken only at a circuit point 1. The output signal Y is acquired by summation of the signals output at the two circuit points e and h with the difference—weighted by the multiplier A—between the signals output at two further circuit points a and c. The bandwidth can be influenced with the multiplier module $K_1$; the resonant frequency can be influenced with the multiplier module $K_2$; and the amplitude can be influenced with the multiplier module A. What this example thus involves is a canonic attenuation equalizer that has the three parameters of $K_1$, $K_2$, and A.

Figure 5:
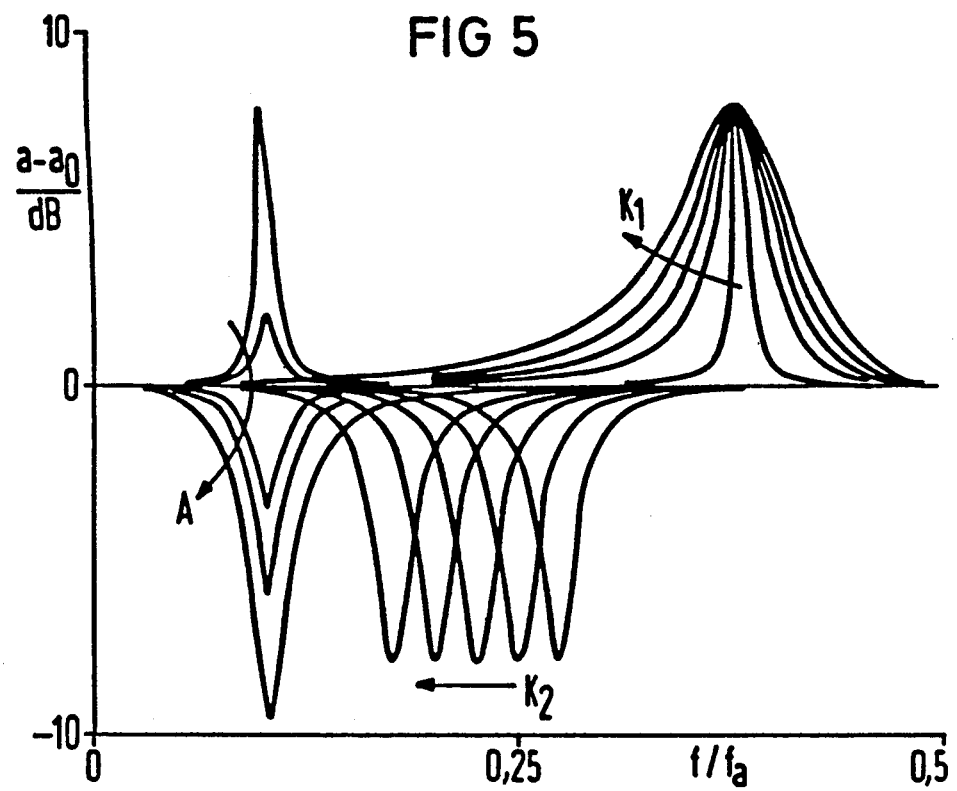
FIG. 5 shows attenuation (a - $a_o$) dependent on a standardized frequency (f/$f_a$) for the equalizer of FIG. 4—the symbols A, $K_1$ and $K_2$ allow their effect in the attenuation curve to be recognized.

FIG. 5 represents examples of a variable attenuation equalizer of FIG. 4. The attenuation $(a-a_O)$ is shown in dependence upon a standardized frequency $f/f_a$. The effect of the three setting parameters $K_1$, $K_2$ and A is shown by the direction of the illustrated arrows.

Figure 6:
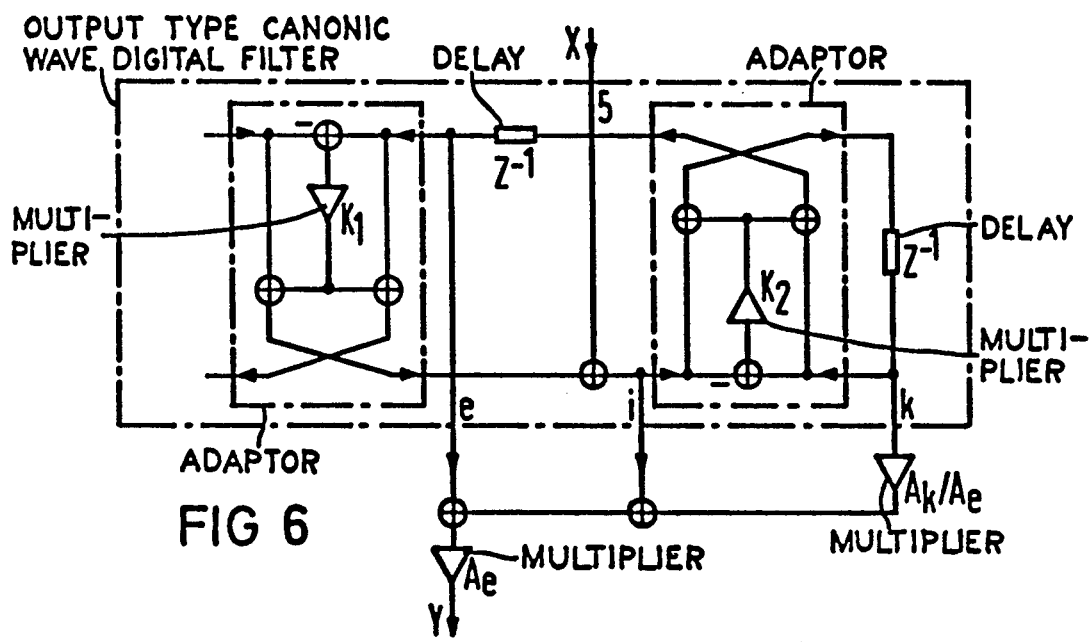
FIG. 6 is an exemplary embodiment of a circuit that represents a so-called output type canonic wave digital filter, the transfer function has the order 2—the (sub-) filter circuit has a structure-conditioned zero location on the z-unit circle which can be realized—parts of the first adaptor can be eliminated.

FIG. 6 shows an exemplary embodiment of what is referred to as an output type canonic filter, i.e. the input of the input signal X with weighting 1 occurs only at one circuit point, namely at the circuit point 5. The output signal is again referenced Y. The circuit represents a canonic (sub-) filter circuit having a conjugated, complex pair of zerolocations that, conditioned by the structure, lie on a z-unit circle. Parts of the first adaptor can be eliminated. The output signal Y is thus formed by the sum—weighted with a first multiplier $A_e$—of the signal output at the two circuit points e and i with the signal output at a further circuit point k, and weighted with a further multiplier $A_k/A_e$.

Figure 7:
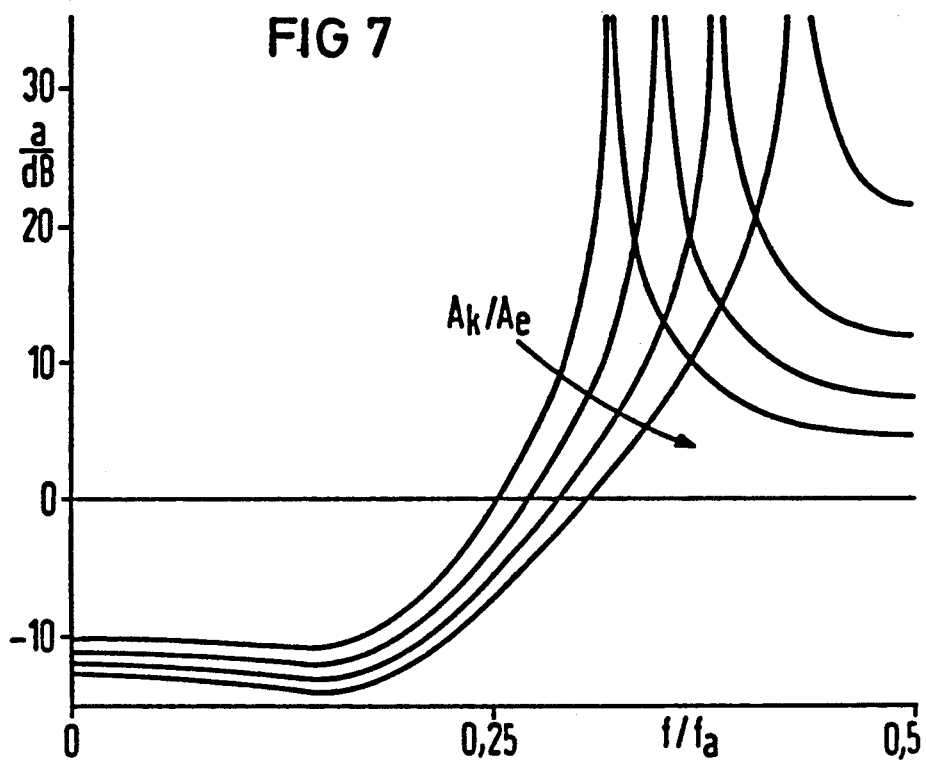
FIG. 7 shows examples of variable attenuation responses for a circuit of FIG. 6—the attenuation a is shown dependent on a standardized frequency $f/f_a$ and the influence of the multiplication factor $A_k/A_e$ can be seen from the direction of the arrow entered therein.

FIG. 7 shows examples of variable attenuation responses relating to the circuit of FIG. 6. The attenuation a is shown dependent on a standardized frequency $f/f_a$. The effect of the multiplier $A_k/A_e$ is identified by the direction of the illustrated arrow.

Figure 8:
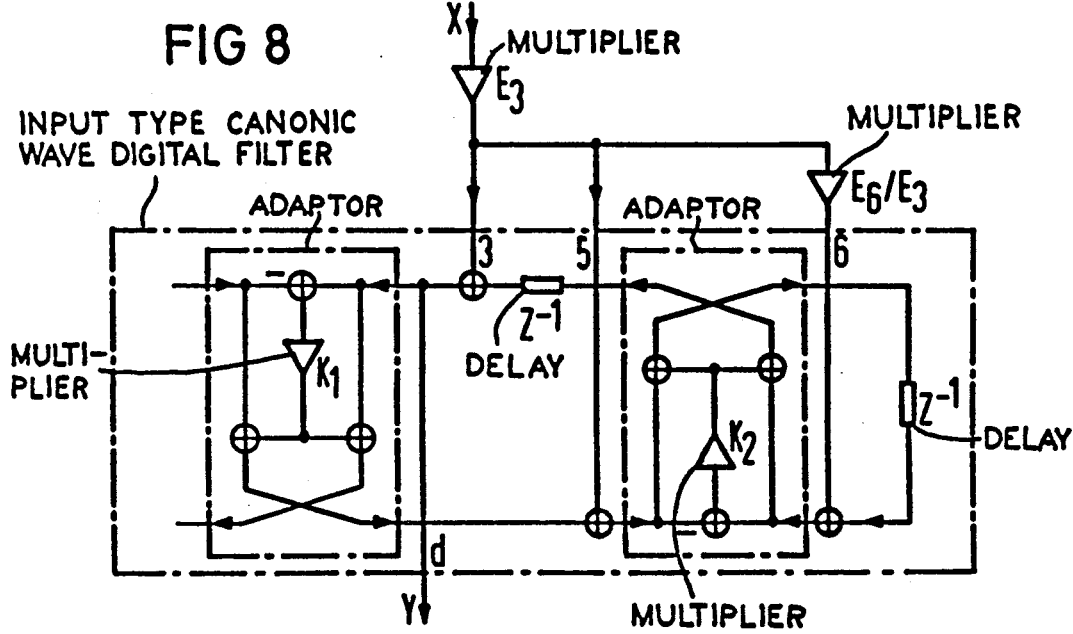
FIG. 8 is an exemplary embodiment of a so-called input type—the transfer function thereby has order 2 (as in FIG. 6)—a (sub-) filter circuit having a structure-conditioned zero location on the z-unit circle results—parts of the first adaptor can be eliminated.

FIG. 8 shows an exemplary embodiment of an input type, i.e. the output of the output signal Y with weighting 1 occurs at only one circuit point, namely at the circuit point d. The input signal is again referenced X. The circuit represents a canonic (sub-) filter circuit having a conjugated, complex zero location pair that, conditioned by the structure, lies on a z-unit circle. Parts of the first adaptor can be eliminated. After a weighting with a first multiplier $E_3$, the input signal X is thus input at the two circuit points 3 and 5 and—via a further weighting with a second multiplier $E_6/E_3$—is input at the circuit point 6.

The illustrated circuits also have the following advantages.

Given the reactionless input and output employed here, the advantageous stability properties of the original wave digital filter structure are preserved when, as usual, care continues to be exercised to maintain the pseudo passivity (2) of the adaptor modules employed.

The fact that the desired transfer function can usually even be realized in a great many ways with the proposed method will be expediently utilized in the dimensioning of the circuit: the actual expense in the structure can be minimized by intentional employment of an optimally great number of multiplier values of zero and one (i.e., "expenditure-less" values) and only a few crooked values (i.e., "true" multiplications). When matching the transfer function to be realized, at least one dimensioning is always possible that requires precisely only the canonic, minimum number of "true" multiplications.

Problem A discussed above does not occur because the systematic employment of pseudo-passive adaptors makes oscillations impossible (at least given the input signal zero).

Problem B discussed above is likewise eliminated; an arbitrary transfer function can even usually be realized with many multiplier value combinations in the above described way.

Problem C discussed above does not arise because the calculating depth of the original wave digital filter all-pass structure is low, and is not increased by the inputs and outputs.

Although various minor changes and modifications might be proposed by those skilled in the art, it will be understood that I wish to include within the claims of the patent warranted hereon all such changes and modifications as reasonably come within my contribution to the art.

I claim as my invention:

1. A wave digital filter, comprising:
wave digital filter circuit means comprising interconnected adaptors, delays, multipliers, and adders for defining an arbitrary transfer function, said circuit means corresponding in order and values to intrinsic values of the transfer function;
a filter input to which a filter input signal is applied and a filter output at which a filter output signal is available;
said filter input being connected to a plurality of inputs of said wave digital filter circuit means by respective multiplier means for individually weighting the input signal to create weighted input signals at each of said wave digital filter circuit means inputs; and
said filter output being connected by respective multiplier means to said wave digital filter circuit means individual outputs for weighting individual output signals from the wave digital filter circuit means.

2. A wave digital filter according to claim 1 wherein the multiplier means are connected to the filter output via adders.

3. A wave digital filter according to claim 1 wherein the wave digital filter circuit means comprises an all-pass structure and wherein said adaptors are two-port adaptors.

4. A wave digital filter according to claim 1 wherein the number of said delays provided corresponds exactly to a number of eigen values of the transfer function, and the number of multipliers of the wave digital filter circuit means corresponds exactly to a number of free parameters in the transfer function.

5. A wave digital filter according to claim 1 wherein the intrinsic values of the transfer function comprises denominator zero locations.

6. A wave digital filter according to claim 1 wherein each of the adaptors of the wave digital filter circuit means has two input terminals and two output terminals, a multiplier having its input connected via a first adder to the two input terminals and having its output connected via second and third adders to the respective two output terminals, and wherein the second and third adders also connect to the respective inputs.

7. A wave digital filter, comprising:
wave digital filter all-pass circuit means for defining a transfer function having two intrinsic values and of order two, said circuit means having a cascaded interconnection of adaptors each having an interconnected multiplier and adders, and respective memories being connected to the adaptors;
a filter input terminal to which an input signal having a weighting one is applied being directly connected at only one input point of the wave digital filter circuit means;
a plurality of individual outputs from the circuit means connecting to an output; and
the wave digital filter circuit means having outputs comprising first through fourth individual outputs, the first and second outputs being connected through a difference circuit means to a multiplier means for weighting to the filter output through a first adder, and wherein the third and fourth individual outputs are connected through a second adder to the filter output through the first adder.

8. A wave digital filter, comprising:
wave digital filter means for defining a transfer function having an order of two and wherein said filter means has interconnected adaptors and respective delays, each of the adaptors having a multiplier and interconnected adders, said filter means having first, second, and third individual inputs and a single individual output;
a filter input at which a filter input signal is provided being connected via a first multiplier to the first and second individual inputs and through a second multiplier to the third individual input; and
a filter output at which an output signal having a weighting of one is available, said filter output being directly connected to the single output of the wave digital filter circuit means which is the only output point of the circuit means.

* * * * *